United States Patent [19]

Imai et al.

[11] Patent Number: 5,225,834
[45] Date of Patent: Jul. 6, 1993

[54] SEMICONDUCTOR INTEGRATED CIRCUIT BOUNDARY SCAN TEST WITH MULTIPLEXED NODE SELECTION

[75] Inventors: Kiyoshi Imai, Kyoto; Toshiaki Tsuji, Osaka; Taku Takada, Kanagawa; Seiichi Taguchi, Kyoto, all of Japan

[73] Assignee: Matsushita Electric Industrial Co., Ltd., Osaka, Japan

[21] Appl. No.: 801,359

[22] Filed: Dec. 2, 1991

[30] Foreign Application Priority Data

Dec. 6, 1990 [JP] Japan .................. 2-400584

[51] Int. Cl.⁵ .................. H03M 1/10; G01R 31/28
[52] U.S. Cl. .................. 341/120; 371/22.1; 324/158 R
[58] Field of Search .............. 341/120; 371/22.1, 22.6, 371/22.3; 324/158 R

[56] References Cited

U.S. PATENT DOCUMENTS

| | | | |
|---|---|---|---|
| 4,872,169 | 10/1989 | Whetsel, Jr. | 371/22.3 |
| 4,922,492 | 5/1990 | Faseng et al. | 371/22.1 |
| 4,967,142 | 10/1990 | Sauerwald et al. | 324/73.1 |
| 5,132,685 | 7/1992 | De Witt et al. | 341/120 |
| 5,132,974 | 7/1992 | Rosales | 371/22.1 |
| 5,150,044 | 9/1992 | Hashizume et al. | 324/158 R |

FOREIGN PATENT DOCUMENTS 63-233384 9/1988 Japan .................. 371/22.1

OTHER PUBLICATIONS

*IEEE Standard Test Access Port and Boundary-Scan Achitecture, IEEE Standard* 11.49.1-1990.

*Primary Examiner*—Howard L. Williams
*Attorney, Agent, or Firm*—Willian Brinks Olds Hofer Gilson & Lione

[57] ABSTRACT

A semiconductor integrated circuit having a test circuit built therein is disclosed which consists of an A/D converter to be connected to a peripheral circuit, a digital circuit connected to the A/D converter, a digital signal switching device for selectively connecting to the output of the A/D converter and that of the digital circuit, and a boundary scan output circuit connected to the output of the digital signal switching device, wherein the digital signal switching device connects the A/D converter to the boundary scan output circuit in a normal mode, while the signal fetched in the boundary scan output circuit is outputted therefrom in test mode. Semiconductor integrated circuits having an analog circuit built therein and an analog integrated circuit in which a test circuit is built-in are also disclosed.

3 Claims, 6 Drawing Sheets

SEMICONDUCTOR INTEGRATED CIRCUIT BOUNDARY SCAN TEST WITH MULTIPLEXED NODE SELECTION

BACKGROUND OF THE INVENTION

1. Field of the Invention

The present invention relates to a semiconductor integrated circuit incorporating a test circuit for mass production tests (referred to as a board test hereinafter) of printed circuit boards with semiconductor and other devices mounted thereon.

2. Description of the Prior Art

The quantity of functions incorporated into a circuit board has been dramatically increased due to the recent advancement of semiconductor technology. It is accordingly most important for a semiconductor integrated circuit mounted onto the board to be suitably designed for the board test in order to secure the quality of the mass-produced board. One representative technique therefor is the boundary scan employed as IEEE standard 1149.1-1990 "IEEE Standard Test Access Port and Boundary-Scan Architecture" (refer to "Simplification of Board Test by Boundary Scan" by Peter Hansen, et al. in Nikkei Electronics dated Jan. 8, 1990, No. 490, pp. 301-7).

Hereinbelow, one example of the semiconductor integrated circuit incorporating the aforementioned boundary scan test circuit will be depicted with reference to FIG. 4.

Figure 4:
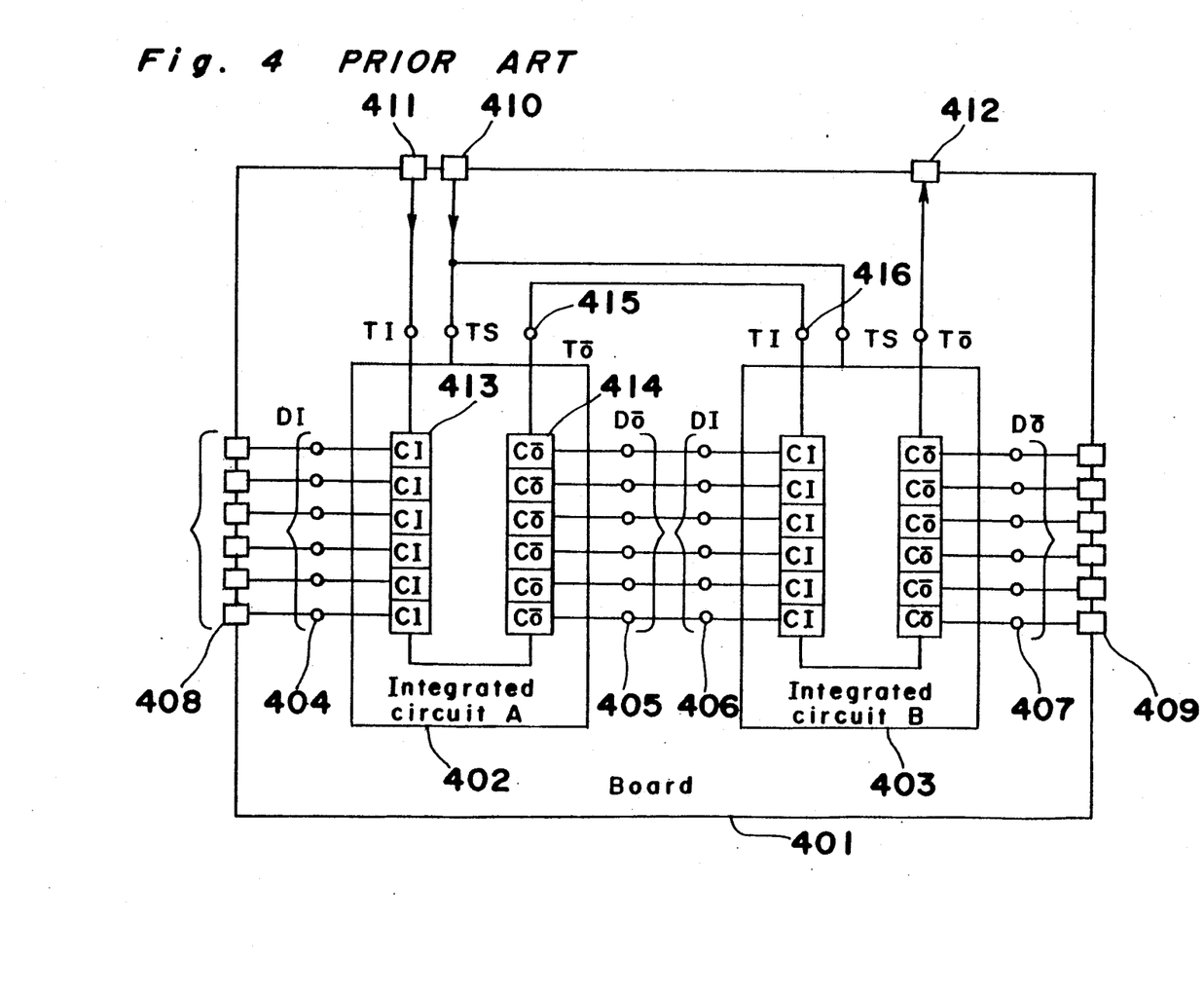
FIG. 4 is a block diagram of a board mounted with a conventional semiconductor integrated circuit.

FIG. 4 is a block diagram of a board mounted with a conventional semiconductor integrated circuit. In FIG. 4, reference numerals denote respectively: 401 a board, 402, 403 integrated circuits A, B mounted on the board 401, 404 a digital signal input terminal of the integrated circuit A402, 405 a digital signal output terminal of the integrated circuit A402, 406 a digital signal input terminal of the integrated circuit B403 the terminal being connected to the digital signal output terminal 405, 407 a digital signal output terminal of the integrated circuit B403, 408 a digital signal input terminal of the board 401, the terminal being connected to the digital signal input terminal 404 of the integrated circuit A402, 409 a digital signal output terminal of the board 401 and connected to the digital signal output terminal 407 of the integrated circuit B403, 410 a test switching terminal connected in common to the integrated circuits A402 and B403, 411 a test signal input terminal of the board 401, 412 a test signal output terminal of the board 401, 413 a boundary scan input circuit, 414 a boundary scan output circuit, 415 a test signal output terminal of the integrated circuit A402, and 416 a test signal input terminal of the integrated circuit B403.

The operation of the board mounted with the conventional semiconductor integrated circuits in the structure as above will be discussed now hereinbelow.

When the test switching terminal 410 is set for the normal operation mode, the boundary scan input circuit 413 of the integrated circuit A402 operates as a normal digital signal input circuit, taking a signal through the digital signal input terminal 408 into the integrated circuit A402. On the other hand, the boundary scan output circuit 414 of the integrated circuit A402 works as a normal digital signal output circuit, by outputting a signal through the digital signal output terminal 405 to the digital signal input terminal 406 of the integrated circuit B403. The integrated circuit B403 operates in the same manner as the integrated circuit A402. Therefore, the signal input through the digital signal input terminal 408 is, on the whole of the board, processed in the integrated circuits A402 and B403 and is outputted to the digital signal output terminal 409. If the mass production quality of the board 401, that is, whether all the input/output terminals of the integrated circuits A402 and B403 are perfectly soldered, is to be confirmed in this state, a signal output to the digital signal output terminal 409, when a complicated test data is input through the digital signal input terminal 408, should be compared with an expected value. According to this method, however, it is necessary to know the input/output response of the integrated circuits A402 and B403 during the normal operation beforehand, and moreover, it is difficult to specify which of the terminals is improperly connected in the case where the expected value is not obtained. The boundary scan test circuit has been devised to solve the aforementioned disadvantages.

When the test switching terminal 410 is set for the test mode, the boundary scan input circuit 413 and the boundary scan output circuit 414 operate as shift registers connected in series. In other words, the signal input through the test signal input terminal 411 is, after going through the input/output circuit of the integrated circuit A402, outputted to the test signal output terminal 415 of the integrated circuit A402. The signal at the test signal output terminal 415 is input to the test signal input terminal 416 of the integrated circuit B403, and output to the test signal output terminal 412 of the board 401 after going through input/output circuit of the integrated circuit B403.

The board 401 will be checked in a manner as described below.

(1) After the test switching terminal 410 is set to the test mode, a signal to set a desired data in the digital signal output terminals 405 and 407 of the integrated circuits A402 and B403 is input through the test signal input terminal 411. The value of the digital signal output terminal 409 is first checked.

(2) Then, the test switching terminal 410 is set to the normal operation mode and the signal from the digital signal input terminal 408 is taken inside through the digital signal input terminal 404 of the integrated circuit A402. The resulting signal from the digital signal output terminal 405 is taken into the integrated circuit B403 through the test signal input terminal 406.

(3) The test switching terminal 410 is switched to the test mode again. The data taken into the integrated circuits A402 and B403 in the above step (2) is taken outside through the test signal input terminal 412 in series and the value is checked.

In the above-described procedure, it is possible to inspect the board 401 without knowing the function of the normal operation of the integrated circuits A402 and B403.

Figure 5:
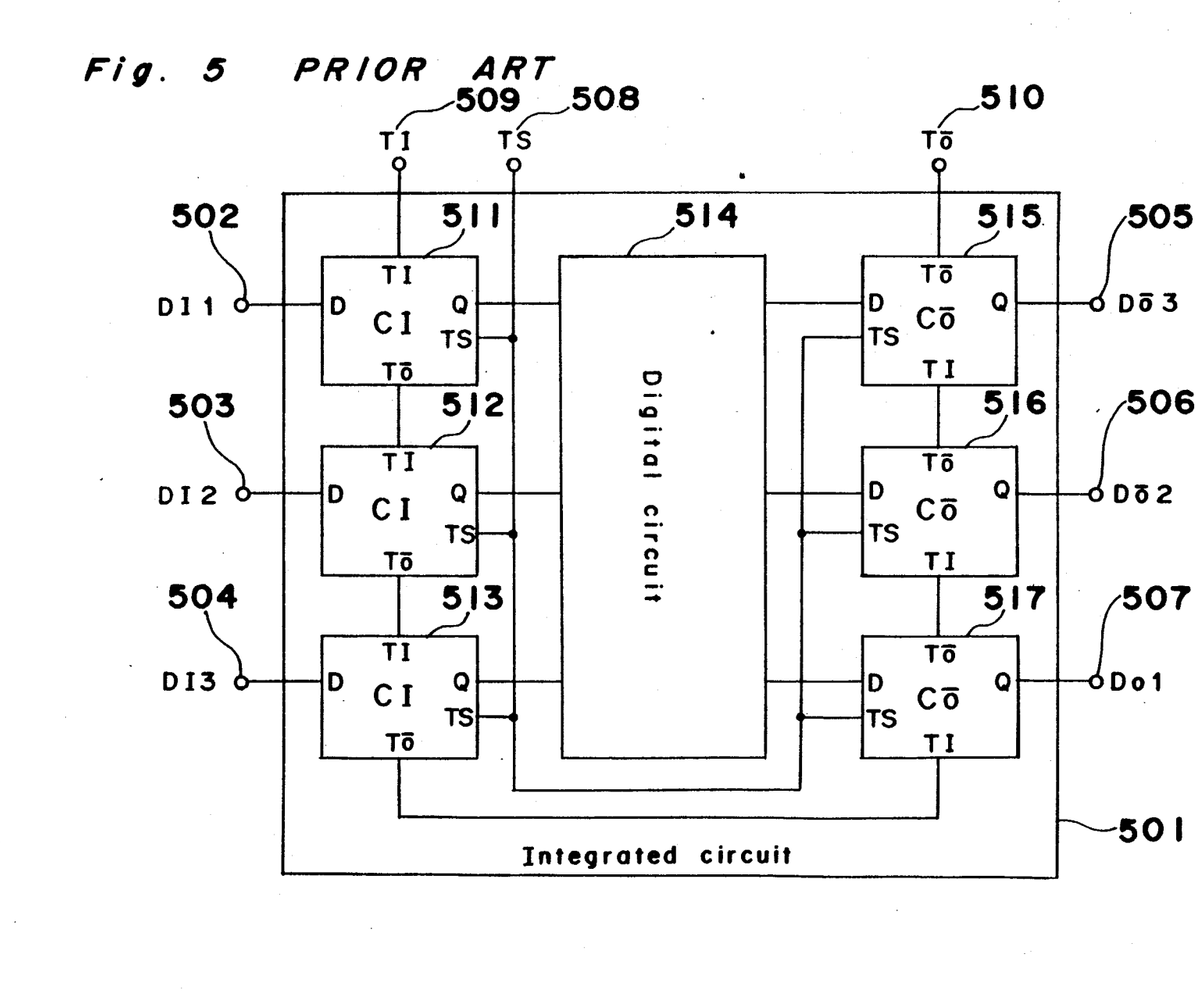
FIG. 5 is a block diagram inside the conventional semiconductor integrated circuit.

Now, the integrated circuits A402 and B403 will be described more in detail with reference to FIG. 5. FIG. 5 is a block diagram indicating the internal structure of the conventional semiconductor integrated circuit, in which reference numerals respectively designate: 501 an integrated circuit, 502 to 504 digital signal input terminals (DI), 505 to 507 digital signal output terminals (DO), 508 a test switching terminal (TS), 509 a test signal input terminal (TI), 510 a test signal output terminal (TO), 511 to 513 boundary scan input circuits (CI), and 515 to 517 boundary scan output circuits (CO). Each of the boundary scan input and output circuits 511 to 513 and 515 to 517 has a digital signal input terminal D, a clock input terminal CK, a digital signal output terminal Q, a test switching terminal TS, a test signal input terminal TI, and a test signal output terminal TO. A digital circuit 514 performs the original function of the integrated circuit 501. The semiconductor integrated circuit of the above structure operates in a manner as follows.

When the test switching terminal 508 is set to the normal mode, the boundary scan input circuits 511 to 513 and the boundary scan output circuits 515 to 517 serve as flip-flops, so that an input through D is output to Q and TO. Therefore, the integrated circuit 501 functions normally. Meanwhile, when the test switching terminal 508 is set for the test mode, the boundary scan input circuits 511 to 513 work as flip-flops to input a signal from TI and output the same to TO, while the boundary scan output circuits 515 to 517 work as flip-flops to have a TI input and Q and TO outputs. The TO output of the boundary scan input circuit 513 is connected to the TI input of the boundary scan output circuit 517. Accordingly, the digital signal input through the test signal input terminal 509 of the integrated circuit 501 is, after passing through the six flip-flops, outputted to the test signal output terminal 510. The operation depicted with reference to FIG. 4 is thus realized.

The internal structure of the boundary scan input circuits (CI) 511 to 513 and boundary scan output circuits (CO) 515 to 517 will be described by way of example with reference to FIGS. 6 and 7.

Figure 6:
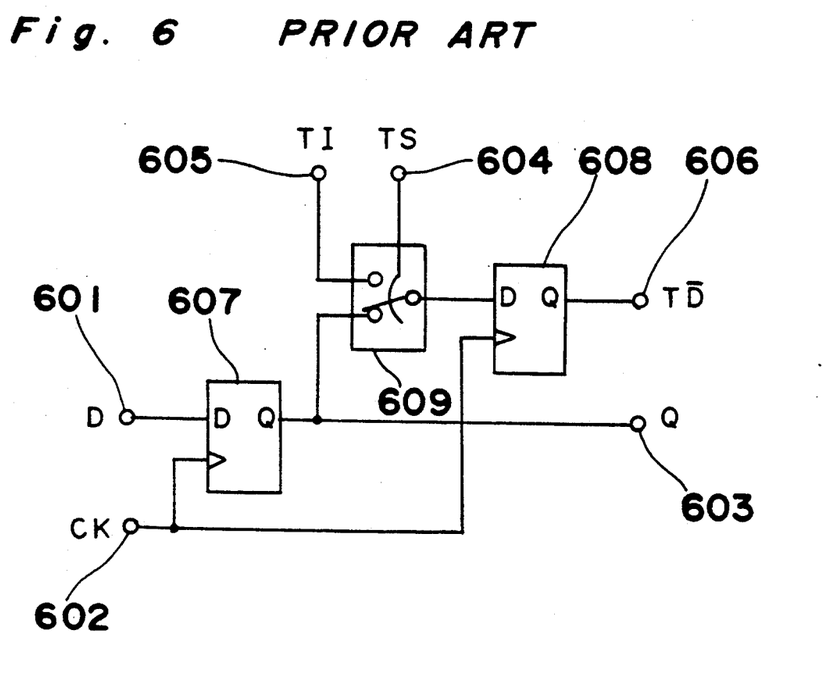
FIG. 6 is a circuit diagram of a boundary scan input circuit within the conventional semiconductor integrated circuit of FIG. 5.

FIG. 6 is a circuit diagram inside the boundary scan input circuit within the conventional semiconductor integrated circuit shown in FIG. 5, in which reference numerals denote respectively: 601 a digital signal input terminal (D), 602 a clock input terminal (CK), 603 a digital signal output terminal (Q), 604 a test switching terminal (TS), 605 a test signal input terminal (TI), 606 a test signal output terminal (TO), 607 and 608 flip-flops, and 609 a digital signal switching device.

The boundary scan input circuit in the above structure operates as described hereinbelow.

With the test switching terminal 604 set to the normal mode, the digital signal switching device 609 is connected to the side of the digital signal input terminal 601. A data input terminal of the flip-flop 608 is connected to the output terminal of the digital signal switching device 609. Therefore, when a clock signal is fed to the clock input terminal 602, the data at the digital signal input terminal 601 is outputted to the digital signal output terminal 603 and the test signal output terminal 606. If the test switching terminal 604 is switched to the test mode, the digital signal switching device 609 is connected to the side of the test signal input terminal 605, so that the data at the digital signal input terminal 601 is outputted to the digital signal output terminal 603 and the data at the test signal input terminal 605 is outputted to the test signal output terminal 606.

Figure 7:
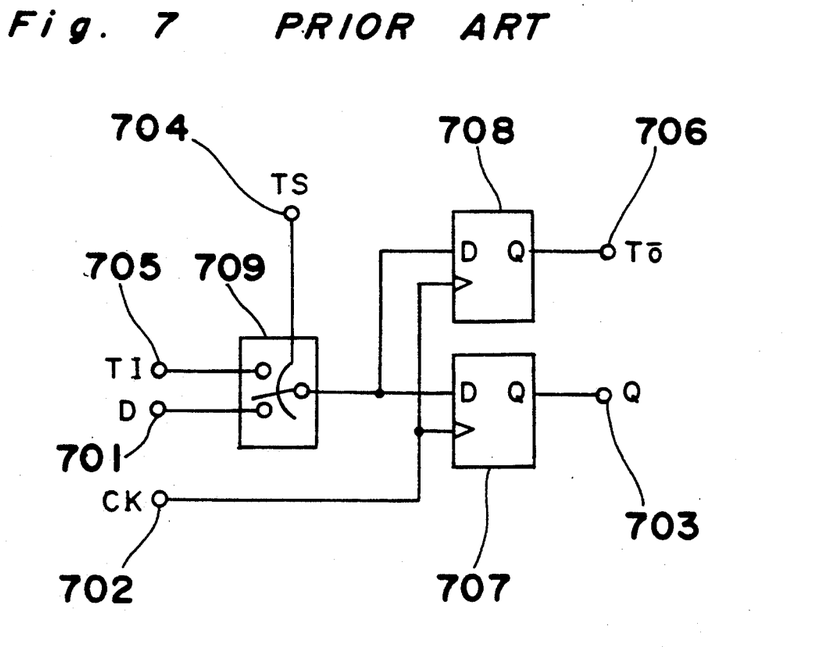
FIG. 7 is a circuit diagram of a boundary scan output circuit within the conventional semiconductor integrated circuit of FIG. 5.

FIG. 7 illustrates an example of a circuit diagram inside the boundary scan output circuit of the conventional semiconductor integrated circuit of FIG. 5. In FIG. 7, reference numerals indicate respectively: 701 a digital signal input terminal (D), 702 a clock input terminal (CK), 703 a digital signal output terminal (Q), 704 a test switching terminal (TS), 705 a test signal input terminal (TI), 706 a test signal output terminal (TO), 707 and 708 flip-flops, and 709 a digital signal switching device.

The operation of the above boundary scan output circuit will be explained below.

When the test switching terminal 704 is set to the normal mode, the digital signal switching device 709 is connected to the side of the digital signal input terminal 701. Since the data inputs at the flip-flops 708 and 707 are both connected to an output of the digital signal switching device 709, the data at the digital signal input terminal 701 is outputted to the digital signal output terminal 703 and the test signal output terminal 706 when a clock signal is added to the clock input terminal 702. If the test switching terminal 704 is in the test mode, the digital signal switching device 709 is connected to the side of the test signal input terminal 705, and the data at the test signal input terminal 705 is outputted to the digital signal output terminal 703 and the test signal output terminal 706.

The operation discussed with reference to FIG. 5 is realized by the above-described boundary scan input-/output circuits.

In the foregoing prior art, all the semiconductor integrated circuits on the board are supposed to be constituted of digital circuits. However, particularly in the case of processing video signals, there may often be mounted both analog circuits and digital circuits on the same board, and thus the boundary scan method cannot meet the board test.

SUMMARY OF THE INVENTION

The object of the present invention is therefore to provide a semiconductor integrated circuit having a test circuit built therein to facilitate the board test of massproduced printed circuit boards having both analog and digital circuits thereon.

In order to achieve the object, the present invention provides a semiconductor integrated circuit comprising a digital circuit and an A/D converter, in which the inputs of digital signal switching devices are outputs of the A/D converter and digital circuit, and boundary scan output circuits are connected to the outputs of the digital signal switching devices.

According to another aspect of the present invention, a semiconductor integrated circuit is provided, which comprises an analog circuit, an A/D converter and a digital circuit, wherein the inputs of an analog signal switching device are outputs of an analog signal input terminal and analog circuit, the inputs of digital signal switching devices are outputs of the A/D converter and digital circuit, and boundary scan output circuits are connected to the outputs of the digital signal switching devices. The A/D converter is connected to an output of the analog signal switching device, and the digital circuit is connected to outputs of the A/D converter.

According to a yet further aspect of the present invention, a semiconductor integrated circuit is provided, which comprises an analog circuit alone, wherein an analog signal switching device has inputs from analog signal input terminals, an A/D converter is connected to an output of the analog signal switching device, and boundary scan output circuits are connected to the outputs of the A/D converter.

In the aforementioned structure, in a semiconductor integrated circuit comprising a digital circuit and an A/D converter, outputs from the A/D converter are set directly to the boundary scan output circuits by the digital signal switching devices, so that the improper connection of an analog circuit in the periphery of the A/D converter mounted outside the semiconductor integrated circuit is inspected.

Further, in a semiconductor integrated circuit comprising an analog circuit, an A/D converter and a digital circuit, an analog signal switching device is provided prior to the A/D converter, so that an input to the analog circuit is sequentially A/D converted and output to the boundary scan output circuits, whereby the improper connection of an analog circuit mounted outside the semiconductor integrated circuit is inspected.

In a semiconductor integrated circuit comprising an analog circuit alone, an A/D converter and boundary scan output circuits for test purposes are added, thereby enabling a board test similar to the other kinds of digital semiconductor integrated circuits.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

A semiconductor integrated circuit according to the present invention will be discussed with reference to the accompanying drawings.

Figure 1:
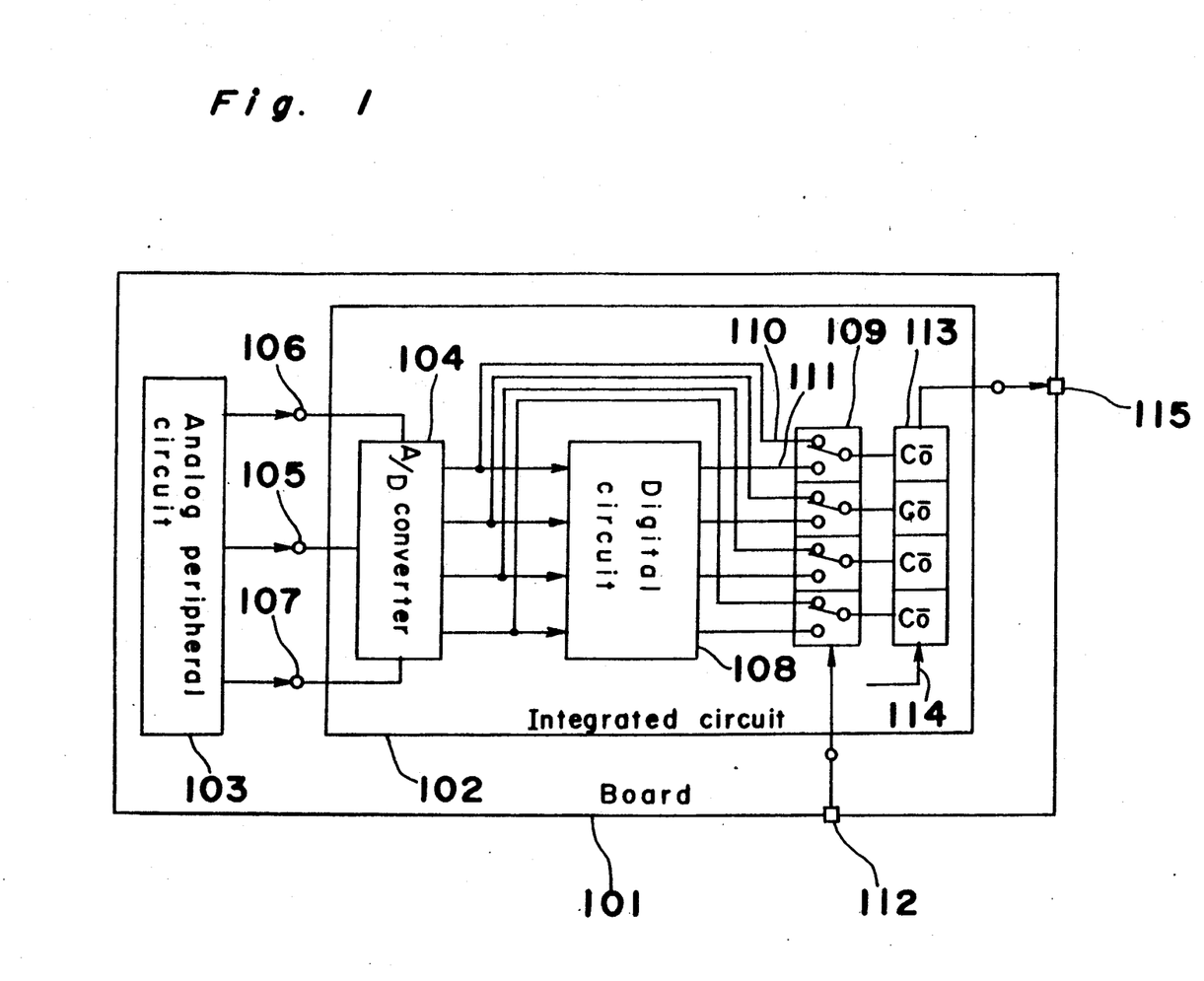
FIG. 1 is a block diagram of a board mounted with a semiconductor integrated circuit according to a first embodiment of the present invention.

FIG. 1 is a block diagram of a board mounted with a semiconductor integrated circuit according to a first embodiment of the present invention.

As shown in FIG. 1 there is arranged an integrated circuit 102 according to the first preferred embodiment with an analog peripheral circuit 103 on a board 101. The integrated circuit 102 is comprised of an A/D converter 104 connected to the analog peripheral circuit 103 via an A/D conversion signal input terminal 105 and reference voltage input terminals 106 and 107, a digital circuit 108 connected to outputs of the A/D converter 104, a digital signal switching device 109 consisting of an array of switching means for selecting either of outputs 110 or 111 of the A/D converter 104 and the digital circuit 108, and a boundary scan output circuit 113 connected to outputs of the digital signal switching circuit 109.

The board 101 has a control terminal 112 for controlling the digital signal switching device 109 in accordance with control signals applied therethrough, a test signal input terminal 114 for inputting test signals to the boundary scan output circuit 113 in the test mode, and a test signal output terminal 115 for outputting a signal in response to a test signal input from the test signal input terminal 114.

The operation of the board mounted with the integrated circuit of the above-described structure will be described hereinbelow.

What is different from the conventional example is that the A/D converter 104 is built in the integrated circuit 102, and the operation of the A/D converter 104 is achieved when being connected to the analog peripheral circuit 103 through the terminals 106 to 107. If the A/D converter 104 is improperly connected to the analog peripheral circuit 103 or the integrated circuit 102, this is detected from a shift of an output data of the A/D converter 104. For inspection of the connection, first, the digital signal switching device 109 is switched by the signal switching control terminal 112 to be connected to the output 110 of the A/D converter 104. At this time, the boundary scan output circuit 113 is held in the normal mode in order to take the outputs of the A/D converter 104 thereinto. Then, after the boundary scan output circuit 113 is set to the test mode, the output data of the A/D converter 104 is taken out from the test signal output terminal 115 in series. The taken-out data is compared with an expected value. Although an error is generated to the expected value because of the analog processing, the error is judged acceptable so long as it is within a preset allowance.

According to the present embodiment, it is easily detected whether or not the analog circuit in the periphery of the A/D converter built in the digital integrated circuit is properly mounted with use of the boundary scan circuit.

Figure 2:
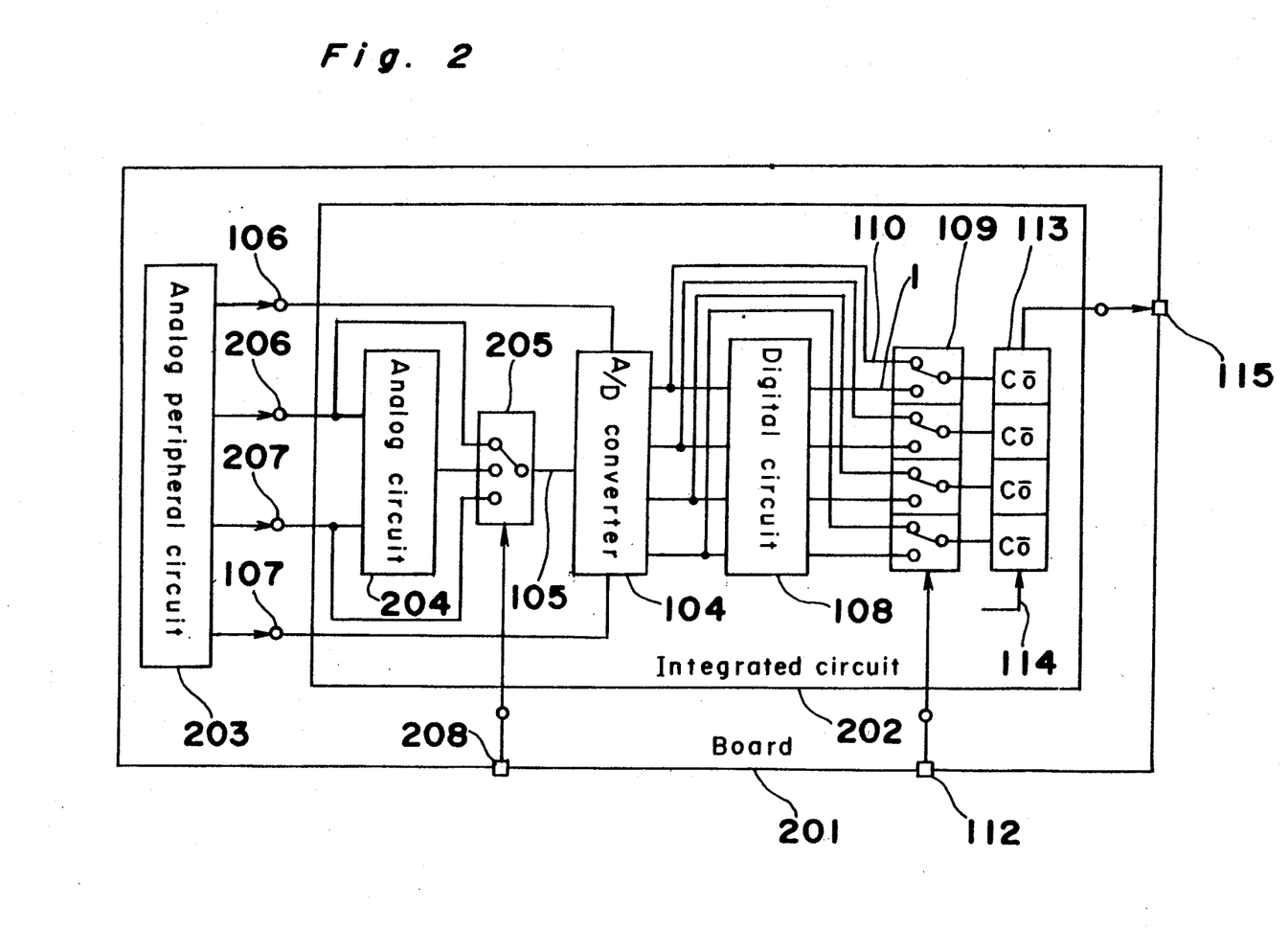
FIG. 2 is a block diagram of a board mounted with a semiconductor integrated circuit according to a second embodiment of the present invention.

FIG. 2 is a block diagram of a board mounted with a semiconductor integrated circuit according to a second embodiment of the present invention. In the drawing, reference numerals respectively denote: 201 a board, 202 an integrated circuit of the instant embodiment, 203 an analog peripheral circuit of the integrated circuit 202, 204 an analog circuit built in the integrated circuit 202, 205 an analog signal switching device, 206 and 207 analog signal input terminals to the integrated circuit 202, and 208 a test switching control terminal to control the analog signal switching device 205. Reference numerals 104 to 115 have the same functions as those indicated by the same references in FIG. 1.

The operation of the board mounted with the integrated circuit as above will be explained hereinbelow.

The difference of the board of FIG. 2 from that of FIG. 1 is that both the analog circuit 204 and the A/D converter 104 are built within the integrated circuit 202. When the test switching control terminal 208 is set in the normal mode, the A/D conversion signal input terminal 105 is connected to the output of the analog circuit 204, thereby performing the normal function. Meanwhile, since the test switching terminal 208 assumes two test modes, the A/D conversion signal input terminal 105 is connected either to the analog signal input terminal 206 or to the analog signal input terminal 207. Therefore, if the output of the A/D converter 104 is checked according to the same procedure as above in FIG. 1, it becomes possible to detect whether the analog signal input terminals 206, 207 or reference voltage input terminals 106, 107 are properly connected to the analog peripheral circuit 203, or whether the analog peripheral circuit 203 connected to these terminals works properly.

According to the second embodiment, it is possible to detect the connecting state of the analog signal input terminals or the analog peripheral circuit even when the terminals or the circuit are directly connected to the A/D converter.

Figure 3:
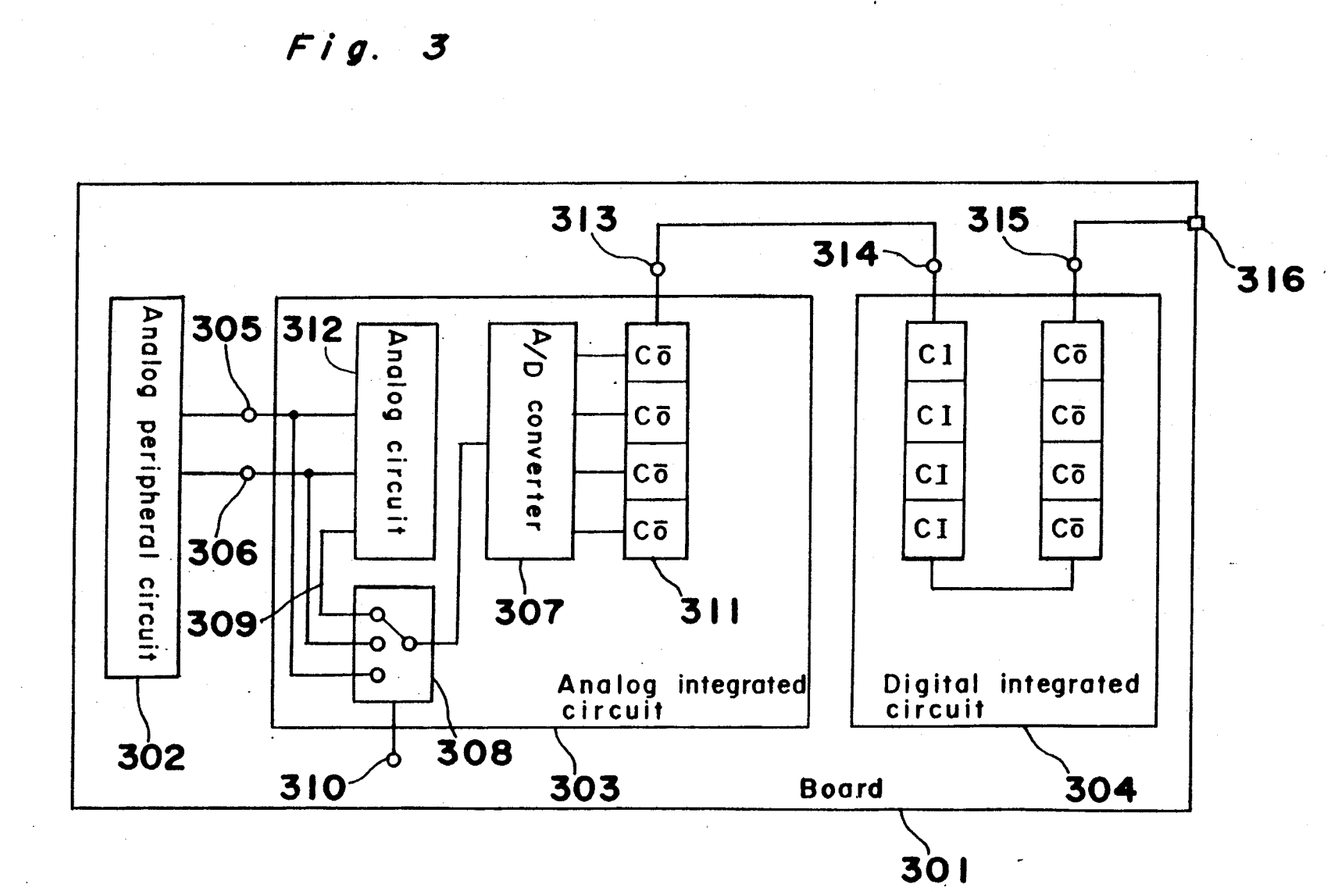
FIG. 3 is a block diagram of a board mounted with a semiconductor integrated circuit according to a third embodiment of the present invention.

Further in FIG. 3, there is shown a block diagram of a board mounted with a semiconductor integrated circuit according to a third embodiment of the present invention. In FIG. 3, reference numerals denote respectively: 301 a board, 302 an analog peripheral circuit, 303 an analog integrated circuit, 304 a digital integrated circuit, 305 and 306 analog signal input terminals, 307 and A/D converter, 308 an analog signal switching device, 311 a boundary scan output circuit, 312 an analog circuit, 313 a test signal output terminal for the analog integrated circuit 303, 314 a test signal input terminal for the digital integrated circuit 304, 315 a test signal output terminal for the digital integrated circuit 304, and 316 a test signal output terminal of the board 301.

The operation of the above-described board will be explained below.

The board of the instant embodiment is different in that the analog integrated circuit 303 is incorporated into the boundary scan circuit. Therefore, there are provided inside the analog integrated circuit 303 the A/D converter 307, analog signal switching device 308 and boundary scan output circuits 311 for test purposes, besides the analog circuit 312. The state of the analog signal input terminals 305, 306, each of which is a connecting terminal to the analog peripheral circuit 302, is sequentially taken into the A/D converter 307 by a test switching control terminal 310, and taken out from the test signal output terminal 313 after being parallel-series converted in the boundary scan output circuits 311. Accordingly, this embodiment is able to detect whether or not the analog signal input terminals 305, 306 are properly connected to the analog peripheral circuit 302, or whether the analog peripheral circuit 302 connected to these terminals is being driven properly.

Therefore, the third embodiment makes the board test possible even when the analog integrated circuit is built into the boundary scan circuit.

As is described hereinabove, the following advantages are achieved by the present invention:

(1) In a semiconductor integrated circuit-comprising a digital circuit and an A/D converter, by providing inputs to digital signal switching devices which are outputs of the A/D converter and the digital circuit, and by providing boundary scan output circuits connected to the outputs of the digital signal switching devices, it becomes possible to inspect the connection of the semiconductor integrated circuit by use of an analog peripheral circuit and the output of the A/D converter, wherein the analog peripheral circuit is mounted outside the semiconductor integrated circuit, or to input the state of the analog peripheral circuit itself.

(2) In a semiconductor integrated circuit comprising an analog circuit, an A/D converter, and a digital circuit, and taking the following steps: by providing inputs to an analog signal switching device which are outputs of the analog signal input terminals and the analog circuit, connecting the A/D converter to an output of the analog signal switching device, connecting the digital circuit to outputs of the A/D converter, providing inputs to digital signal switching devices which are outputs from the A/D converter and digital circuit, and by connecting boundary scan output circuits connected to outputs of the digital signal switching devices, it becomes possible to inspect the connection of the semiconductor integrated circuit by use of an analog peripheral circuit mounted outside the semiconductor integrated circuit, or to inspect the state of the analog peripheral circuit itself.

(3) In a semiconductor integrated circuit consisting of an analog circuit alone, by providing an analog signal switching device connected to outputs of analog signal input terminals, by connecting an A/D converter to an output of the analog signal switching device, and by connecting boundary scan output circuits to outputs of the A/D converter, it becomes possible, similar to the other digital semiconductor integrated circuits, to inspect the connection of the semiconductor integrated circuit by use of a peripheral circuit with input terminals, or to inspect the state of the peripheral circuit itself, according to a simple inspecting program.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor integrated circuit comprising:
   an A/D converter to be connected to an analog peripheral circuit;
   a digital circuit connected to the output side of said A/D converter;
   a digital signal switching device connected to the output side of said A/D converter and to the output side of said digital circuit, said digital signal switching device switching from the former output to the latter output or vice versa in accordance with a switching control signal applied thereto; and
   a boundary scan output circuit connected to the output side of said digital signal switching device, said boundary scan output circuit being operable in a normal mode wherein outputs of said digital signal switching device are fetched thereinto, and in a test mode wherein the fetched outputs of said digital signal switching device are outputted from said boundary scan output circuit sequentially in response to a test signal inputted thereto.

2. A semiconductor integrated circuit comprising:
   an analog circuit to be connected to an analog peripheral circuit;
   an analog signal switching device for switching from the outputs of said analog peripheral circuit to the outputs of said analog circuit or vice versa in accordance with a switching control signal applied thereto;
   an A/D converter connected to the output side of said analog signal switching device;
   a digital circuit connected to the output side of said A/D converter;
   a digital signal switching device connected to the output side of both said A/D converter and said digital circuit, said digital signal switching device switching from the output of said A/D converter to the output of said digital circuit of vice versa in accordance with a switching control signal applied thereto; and a boundary scan output circuit connected to the output side of said digital signal switching device, said boundary scan output circuit being operable in a normal mode wherein outputs of said digital signal switching device are fetched thereinto, and in a test mode wherein the fetched outputs of said digital signal switching device are outputted from said boundary scan output circuit sequentially in response to a test signal inputted thereto.

3. A semiconductor integrated circuit comprising an analog integrated circuit, being characterized in that said analog integrated circuit comprises an analog circuit to be connected to an analog peripheral circuit, an A/D converter connected, via a switching means, to both the input and the output sides of said analog circuit, and a boundary scan output circuit connected to the output side of said A/D converter, wherein said switching means connects to the output of said analog circuit in a normal mode, and switches so as to connect sequentially the input of said analog peripheral circuit to said A/D converter in a test mode, in response to a test signal applied to said switching means.

* * * * *